US011867775B2

(12) United States Patent
Elmquist et al.

(10) Patent No.: US 11,867,775 B2
(45) Date of Patent: Jan. 9, 2024

(54) SYSTEMS, DEVICES, AND METHODS FOR RESISTANCE METROLOGY USING GRAPHENE WITH SUPERCONDUCTING COMPONENTS

(71) Applicants: UNIVERSITY OF MARYLAND, COLLEGE PARK, College Park, MD (US); GOVERNMENT OF THE UNITED STATES OF AMERICA, AS REPRESENTED BY THE SECRETARY OF COMMERCE, NATIONAL INSTITUTE OF STANDARDS AND TECHNOLOGY, Gaithersburg, MD (US)

(72) Inventors: Randolph Elmquist, Gaithersburg, MD (US); Albert Rigosi, Rockville, MD (US); Mattias Kruskopf, Washington Grove, MD (US)

(73) Assignees: Government of the United States of America, Gaithersburg, MD (US); University of Maryland, College Park, College Park, MD (US)

( * ) Notice: Subject to any disclaimer, the term of this patent is extended or adjusted under 35 U.S.C. 154(b) by 10 days.

(21) Appl. No.: 17/435,807

(22) PCT Filed: Mar. 4, 2020

(86) PCT No.: PCT/US2020/020969
§ 371 (c)(1),
(2) Date: Sep. 2, 2021

(87) PCT Pub. No.: WO2020/180977
PCT Pub. Date: Sep. 10, 2020

(65) Prior Publication Data
US 2022/0146597 A1 May 12, 2022

Related U.S. Application Data (60) Provisional application No. 62/813,526, filed on Mar. 4, 2019.

(51) Int. Cl.
*G01R 33/00* (2006.01)
*G01R 33/035* (2006.01)
(Continued)

(52) U.S. Cl.
CPC ....... *G01R 33/0052* (2013.01); *G01R 33/035* (2013.01); *G01R 33/07* (2013.01); *H10N 60/81* (2023.02); *H10N 60/85* (2023.02)

(58) Field of Classification Search
CPC .. G01R 33/0052; G01R 33/035; G01R 33/07; G01R 27/14; G01R 35/007; H10N 60/81; H10N 60/85; H10N 52/01; H10N 52/80
See application file for complete search history.

(56) References Cited

U.S. PATENT DOCUMENTS

| 2009/0140801 A1* | 6/2009 | Ozyilmaz | B82Y 10/00 257/29 |
| 2009/0303638 A1* | 12/2009 | Ogawa | G01R 33/095 257/E21.334 |

(Continued)

FOREIGN PATENT DOCUMENTS

| EP | 3106432 A1 | 12/2016 |
| KR | 1020170097828 A | 8/2017 |

OTHER PUBLICATIONS

International Search Report issued in corresponding International Application No. PCT/US2020/020969, dated May 28, 2020, pp. 1-12.

(Continued)

*Primary Examiner* — Alvaro E Fortich
(74) *Attorney, Agent, or Firm* — Carter, DeLuca & Farrell LLP; George Likourezos; David C. Lee (57) ABSTRACT

A quantum Hall resistance apparatus is to improve resistance standards and includes a substrate, a graphene epitaxially grown on the substrate and having a plurality of first contact patterns at edges of the graphene, a plurality of contacts, each including a second contact pattern and configured to connect to a corresponding first contact pattern, and a (Continued)

protective layer configured to protect the graphene and to increase adherence between the first contact patterns and the second contact patterns. The contacts become a superconductor at a temperature lower than or equal to a predetermined temperature and under up to a predetermined magnetic flux density.

22 Claims, 10 Drawing Sheets

(51) Int. Cl.
*G01R 33/07* (2006.01)
*H10N 60/81* (2023.01)
*H10N 60/85* (2023.01)

(56) References Cited

U.S. PATENT DOCUMENTS

| | | | |
|---|---|---|---|
| 2014/0008616 A1 | 1/2014 | Geim et al. | |
| 2014/0179026 A1* | 6/2014 | Xue | H10N 52/01 438/3 |
| 2015/0123755 A1* | 5/2015 | Shibata | G11B 5/65 335/296 |
| 2017/0229160 A1* | 8/2017 | Ma | H10N 52/00 |

OTHER PUBLICATIONS

Lafont, F. et al., "Quantum Hall resistance standards from graphene grown by chemical vapour deposition on silicon carbide" Nature Communications (Apr. 2015) pp. 1-9.
Di Bartolomeo, A. et al., "Graphene field effect transistors with niobium contacts and asymmetric transfer characteristics" Nanotechnology (Nov. 2015) pp. 1-19, vol. 26, issue 47.
"Critical Magnetic Fields for Superconductors" retrieved online <https://hyperphysics.phy-astr.gsu.edu/hbase/Solids/scbc.html>, (Jan. 2019), pp. 1-4.
De Heer, et al. "Large area and structured epitaxial graphene produced by confinement controlled ublimation of silicon carbide", PNAS, Oct. 11, 2011, pp. 16900-16905, vol. 108, No. 41 (6 pages).
Yu, et al. "New synthesis method for the growth of epitaxial graphene", Journal of Electron Spectroscopy and Related Phenomena, 2011, pp. 100-106, vol. 184, Elsevier B.V. (7 pages).
Sarkar et al., "Organometallic Hexahapto Functionalization of Single Layer Graphene as a Route to High Mobility Graphene Devices", Adv. Mater., 2013, pp. 1131-1136, vol. 15, WILEY-VCH Verlag Gmbh & Co. (6 pages).
Rickhaus et al., "Quantum Hall Effect in Graphene with Superconducting Electrodes", Nano Letters, 2012, 1942-1945, vol. 12, American Chemical Society (4 pages).
Real, et al., "Graphene Epitaxial Growth on SiC(0001) for Resistance Standards", IEEE Transactions on Instrumentation and Measurement, Jun. 2013, pp. 1454-1460, vol. 62, No. 6 (7 pages).
Yang et al., "Low Carrier Density Epitaxial Graphene Devices on SiC", Small Nano Micro, 2014, pp. 1-6, vol. 11, Issue 1, Wiley-VCH Verlag GmbH & Co. (6 pages).
Lartsev, et al., "A prototype of RK/200 quantum Hall array resistance standard on epitaxial graphene", Journal of Applied Physics, Jul. 29, 2015, pp. 44506-44506-6, No. 118, AIP Publishing (7 pages).
Calado, et al., "Ballistic Josephson junctions in edge-contacted graphene", Nature Nanotechnology, Sep. 2015, pp. 761-765, No. 10 (5 pages).
Kruskopf, et al., "Comeback of epitaxial graphene for electronics: large-area growth of bilayer-free graphene on SiC", 2D Materials, 2016, pp. 1-9, No. 3, IOP Publishing (10 pages).
Yang et al., "Epitaxial graphene homogeneity and quantum Hall effect in millimeter-scale devices", Carbon, 2017, pp. 229-236, No. 115, Elsevier Ltd. (8 pages).
Rigosi, et al., "A Table-Top Graphene Quantized Hall Standard", IEEE Trans. Instrument Measurements, 2019, pp. 1-2 (2 pages).
Kruskopf et al., "Epitaxial graphene for quantum resistance metrology", Metrologia, 2018, pp. R27-R36, No. 55 (11 pages).
Kruskopf, et al., "Next-generation crossover-free quantum Hall arrays with superconducting interconnections", Metrologia, 2019, pp. 1-11, No. 56(6) (12 pages).
Kruskopf et al., "Two-Terminal and Multi-Terminal Designs for Next-Generation Quantized Hall Resistance Standards: Contact Material and Geometry", IEEE Transactions on Electron Devices, Sep. 2019, pp. 3973-3977, vol. 66, No. 9 (5 pages).
Rigosi et al., "Electrical Stabilization of Surface Resistivity in Epitaxial Graphene Systems by Amorphous Boron Nitride Encapsulation", ACS Omega, 2017, pp. 2326-2332, No. 2 (7 pages).
Rigosi et all., "Gateless and reversible Carrier density tunability in epitaxial graphene devices functionalized with chromium tricarbonyl", Carbon,, 2019, pp. 468-474, No. 142 (7 pages).
He et al., "Polymer-encapsulated molecular doped epigraphene for quantum resistance metrology", Metrologia, 2019, pp. 1-9, No. 56 (10 pages).
Lee, et al., "Proximity coupling in superconductor-graphene heterostructures", Department of Physics, Harvard University (58 pages); (also published in Reports on Progress in Physics, Mar. 28, 2018, No. 81, IOPScience).
Che et al., "Retained Carrier-Mobility and Enhanced Plasmonic-Photovoltaics of Graphene via ring-centered n6 Functionalization and Nanointerfacing", Nano Letters, 2017, pp. 4381-4389, No. 17 (9 pages).

* cited by examiner

SYSTEMS, DEVICES, AND METHODS FOR RESISTANCE METROLOGY USING GRAPHENE WITH SUPERCONDUCTING COMPONENTS

CROSS-REFERENCE TO RELATED APPLICATIONS

This application is a U.S. National Stage Application filed under 35 U.S.C. § 371(a) claiming the benefit of and priority to International Patent Application No. PCT/US2020/020969, filed Mar. 4, 2020, which claims the benefit of, and priority to, U.S. Provisional Patent Application No. 62/813,526, filed on Mar. 4, 2019, of which entire contents are hereby incorporated by reference.

GOVERNMENT SUPPORT STATEMENT

This invention was made with government support under 70NANB16H168 awarded by the National Institute of Standards and Technology. The government has certain rights in the invention.

BACKGROUND

Technical Field

The present disclosure relates generally to resistance metrology and, more particularly, to resistance standards using graphene with superconductor materials.

Related Art

Graphene was first isolated as micrometer-size exfoliated flakes from bulk graphite and found to have favorable electrical and optical properties. Scalability and homogeneity of the graphene have improved to the point that one can realize devices suitable for general applications, like larger scale electronics, and more specialized applications, such as quantized Hall resistance standards.

Limitations of reliable access to the quantum Hall plateaus other than v=2 have motivated efforts to create a system of devices in series and in parallel, specifically for the development of quantum Hall array resistance standards ("QHARS"). These quantum resistance devices show promises in fulfilling the requirement of scalability for applications in metrology. One issue for these scalable resistance networks, based on multiple Hall bar elements, is that they suffer from accumulated internal resistances directly from contacts, spreading, and wires, and unwanted Hall resistance contributions from resistive metallic interconnections.

Further, even though the graphene has shown superior properties for the development of quantum Hall resistance (QHR) standards, one major difficulty with a QHR device based on the graphene is that their electrical properties drift slowly over time if the QHR device is stored in air due to adsorption of atmospheric molecular dopants. Generally, lower carrier densities will yield unreliable plateaus and higher carrier densities correlate to a plateau onset at higher magnetic flux densities.

SUMMARY

The present disclosure relates to resistance metrology systems, devices, and methods, which improve resistance standards and are scalable by tailoring the equivalent value to meet the needs. QHR devices may be fabricated in large, scalable resistance networks based on multiple Hall bar elements that do not suffer from accumulated internal resistances due to contacts and resistive metallic interconnections by using superconducting connections in combination with improved contact geometries. Further, chemically functionalizing the graphene may extend the life of the quantum Hall resistance apparatuses.

In accordance with aspects of the present disclosure, a quantum Hall resistance apparatus is to improve resistance standards and includes a substrate, a plurality of Hall bars made of a graphene electrical conduction layer, which is epitaxially grown on the substrate, each Hall bar having a plurality of first contact patterns at edges of the graphene, a plurality of contacts, each including a second contact pattern and configured to connect to a corresponding first contact pattern, and a protective layer configured to protect the graphene and to increase adherence between the first contact patterns and the second contact patterns. The contacts become a superconductor at a temperature lower than or equal to a predetermined temperature and under up to a predetermined magnetic flux density.

In aspects, each first contact pattern includes at least two extensions therefrom. Each second contact pattern fits to a corresponding first contact pattern.

In aspects, the predetermined temperature is 12.5 Kelvin.

In aspects, the predetermined magnetic flux density is 9 Tesla.

In aspects, the protective layer is formed of palladium and gold.

In aspects, the plurality of contacts are made of niobium, titanium, nitrogen, or any combination thereof.

In aspects, the graphene is a mono-layer.

In aspects, the quantum Hall resistance apparatus is functionalized with chromium tricarbonyl $(Cr(CO)_3)$.

In aspects, the substrate is a 4H—SiC(0001) semi-insulating substrate with a miscut, relative to the (0001) atomic plane of the 4H—SiC(0001), which is less than or equal to 0.10°.

In aspects, the plurality of contacts with respect to the plurality of Hall bars are connected in series, parallel, or combination thereof to make a resistance standard.

In accordance with aspects of the present disclosure, a method is disclosed for making a quantum Hall bar resistance apparatus to improve resistance standards. The method includes providing a substrate, epitaxially growing graphene to form an electrical conduction layer on the substrate, etching the graphene to make a plurality of Hall bars, each including a plurality of first contact patterns at edges thereof, performing lithographic processes to lay a protective layer configured to protect the plurality of first contact patterns, and adding a plurality of contacts over the protective layer, each contact having a second contact pattern to connect to a corresponding first contact pattern. The plurality of contacts become a superconductor at a temperature lower than or equal to a predetermined temperature and under up to a predetermined magnetic flux density.

In aspects, epitaxially growing the graphene includes placing the substrate into a furnace, purging the substrate with argon, and step-wisely increasing a temperature in the furnace to 1875° C. at a same rate in an environment including argon and hydrogen.

In aspects, the hydrogen is removed from the furnace at 1050° C.

In aspects, a silicon face of the substrate is in contact with a polished graphite slab in the furnace.

In aspects, the predetermined temperature is 12.5 Kelvin.

In aspects, the predetermined magnetic flux density is 9 Tesla.

In aspects, the protective layer is formed of palladium and gold.

In aspects, the method further includes functionalizing the quantum Hall bar resistance apparatus with chromium tricarbonyl ($Cr(CO)_3$).

In aspects, the contacts are made of niobium, titanium, nitrogen, and any combination thereof.

In aspects, the method further includes mounting the quantum Hall bar resistance apparatus over a leadless chip carrier, and bonding wires between the quantum Hall bar resistance apparatus and the leadless chip carrier.

Further details and aspects of the present disclosure are described in more detail below with reference to the drawings.

BRIEF DESCRIPTION OF THE DRAWINGS

The accompanying drawings, which are incorporated in and constitute a part of the specification, illustrate aspects of the disclosure and together with a general description of the disclosure given above, and the detailed description of the aspects given below, serve to explain the principles of the present disclosure.

DETAILED DESCRIPTION

The present disclosure relates to systems and methods for making a quantum Hall resistance device for resistance metrology. The quantum Hall resistance device includes a network of Hall bar elements, which can be configured to make a resistance standard, which can be used for resistance metrology. The Hall bar elements are made of graphene and connected to contacts, which are made of superconducting material so as to decrease resistances between the Hall bar elements and the contacts. The graphene is epitaxially grown on a substrate and shows electrically improved conductivity.

When the graphene is chemically functionalized, the carrier density may be controlled or stabilized under ambient conditions, thereby enlarging the life of the quantum Hall resistance devices.

Figure 1:
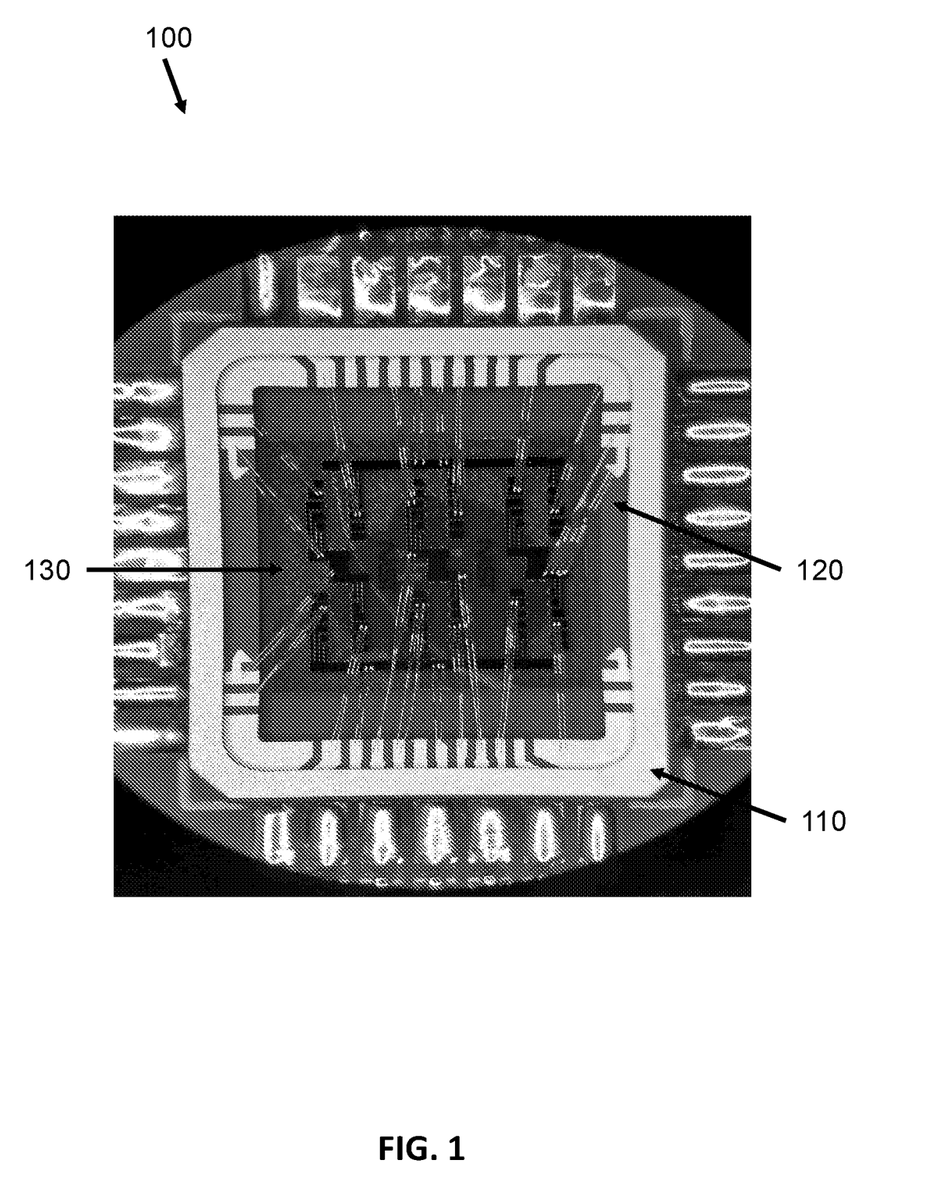
FIG. 1 is a graphical illustration of a quantum Hall resistance device in accordance with aspects of the present disclosure.

FIG. 1 shows a quantum Hall resistance device 100 in accordance with aspects of the present disclosure. The illustrated quantum Hall resistance device 100 includes a leadless chip carrier 110 and an array of quantum Hall bar elements 130. The leadless chip carrier 110 is connected to the array of quantum Hall bar elements via wires 120.

In accordance with aspects of the present disclosure, the quantum Hall bar elements 130 are made of graphene, which is epitaxially grown on a substrate. The graphene may have a mono layer, which exhibits electrically and optically improved characteristics. Further, materials of contacts are made of a superconducting material so that resistance or interconnection resistance between the contacts and the graphene may be significantly reduced.

Generally, at an interface between a superconducting material and a normal material, a particle scattering (i.e., Andreev reflection) occurs. In other words, when one electron in the normal material reaches the interface, a corresponding hole in the normal material is also transferred to the superconducting materials. However, by using the graphene, quantized Hall resistance deviations caused by Andreev reflections may be prevented.

Figure 2A:
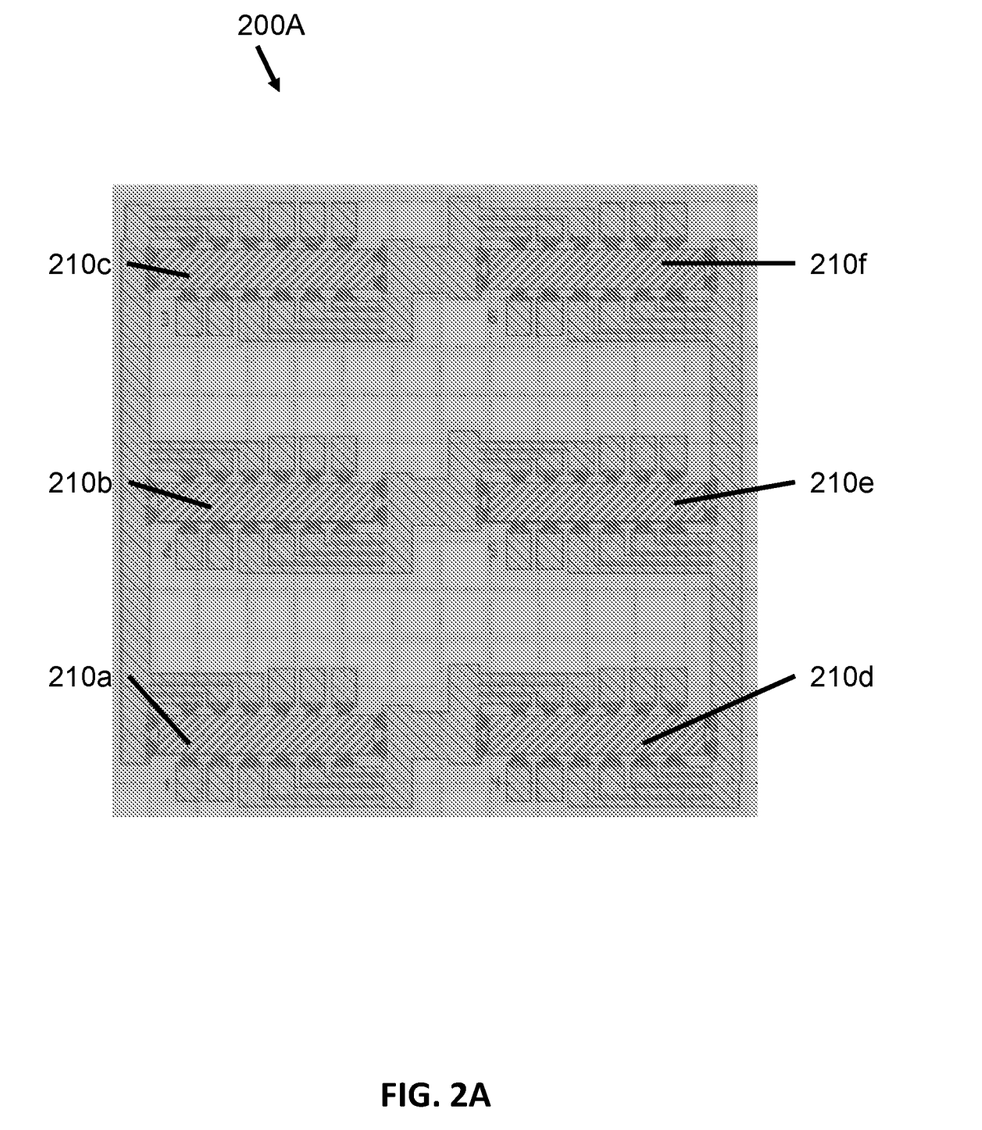
FIGS. 2A-2C are graphical configurations of a plurality of contacts for graphene quantum Hall bar elements in accordance with aspects of the present disclosure.
Figure 2B:
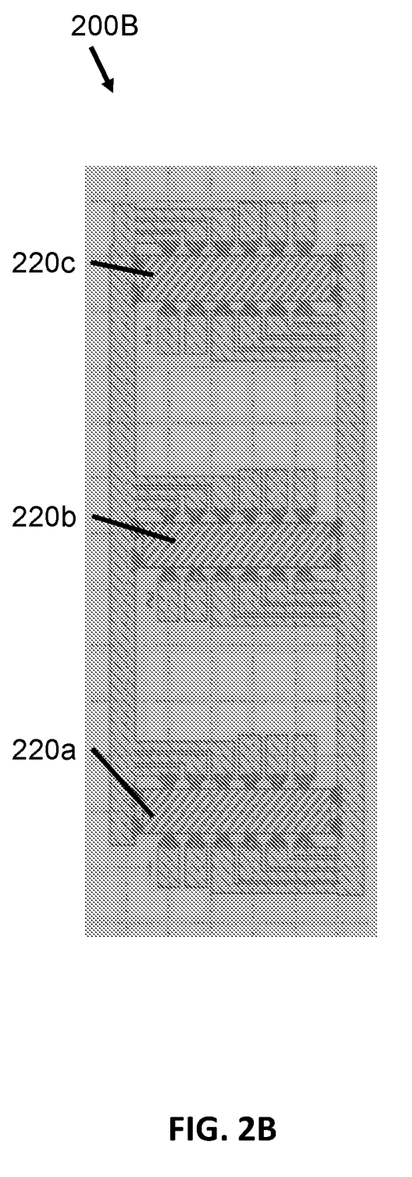
Figure 2C:
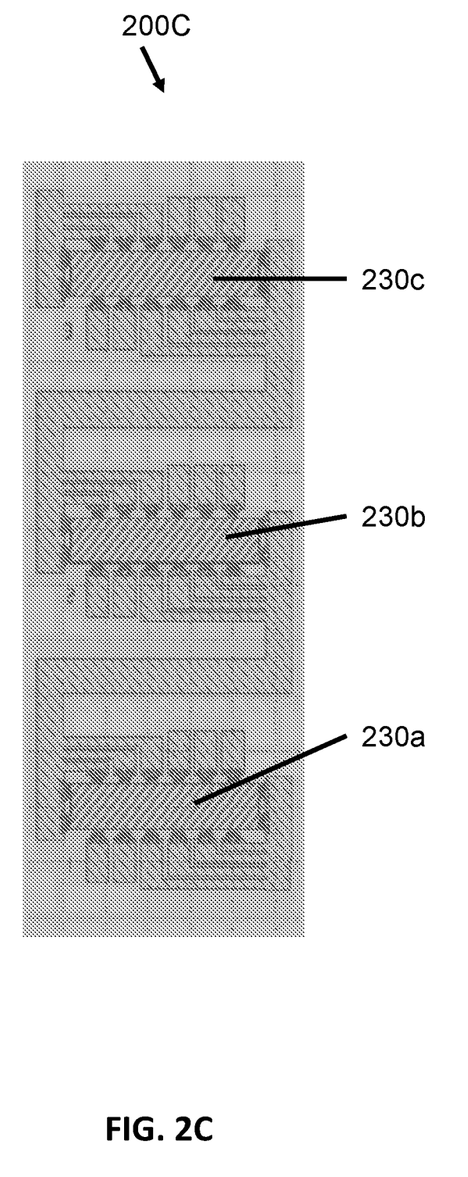

The quantum Hall resistance device 100 may include several configurations of the quantum Hall bar elements 130 so as to make a resistance standard in need. For example, FIGS. 2A-2C show examples of contact configurations of graphene quantum Hall bar elements in accordance with aspects of the present disclosure. The graphene quantum Hall bar element 200A of FIG. 2A may include three pairs of graphene bar elements 210a-210f. The graphene bar elements 210a and 210d are one pair, the graphene bar elements 210b and 210e are another pair, and the graphene bar elements 210c and 210f are the other pair. Graphene bar elements in each pair are connected in series and three pairs of the graphene bar elements 210a-210f are connected in parallel.

Each graphene bar element may include six contact positions on the long side and two contact positions on the short side. However, the number of contact positions may vary dependent upon requirements of the resistance standards.

In another example shown in FIG. 2B, the graphene quantum Hall bar element 200B may include three graphene bar elements 220a-220c, which are connected in parallel. As shown in FIG. 2C, the graphene quantum Hall bar element 200C may include three graphene bar elements 230a-230c, which are connected in series. These three examples shown in FIGS. 2A-2C may be combined in any feasible ways to meet the required resistance standard. Further, the number of graphene bar elements may be increased or decreased, the number of parallel connections or series connections may be increased or decreased to meet the requirements of the resistance standard.

Figure 3A:
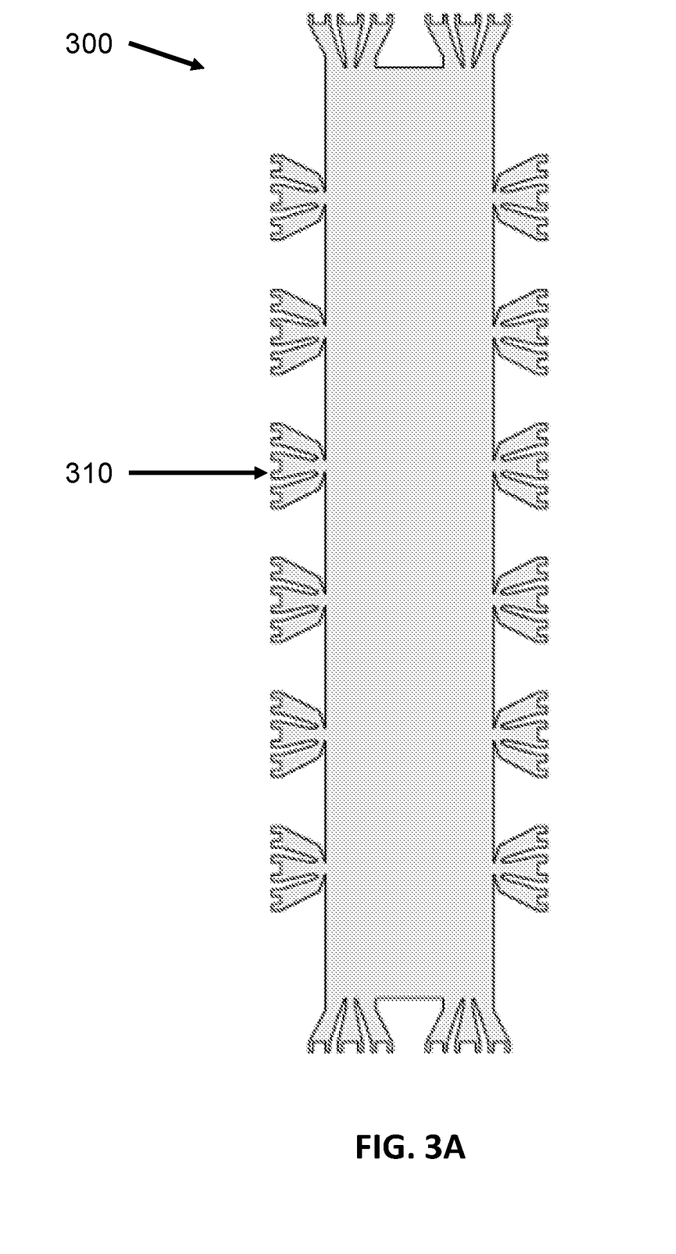
FIG. 3A is a diagram of a graphene quantum Hall bar element of FIGS. 2A-2C in accordance with aspects of the present disclosure.

FIG. 3A illustrates a diagram of a graphene quantum Hall bar element 300 in accordance with aspects of the present disclosure. The graphene quantum Hall bar element 300 may include six contact pads 310 on the long side and two contact pads 310 on the short side. Each contact pad 310 may be split into several branches. As shown in FIG. 3A, the contact pad 310 has three branches. The split branches of the contact pad 310 may allow for the edge states to equilibrate with the electric potential of the source/drain contacts in the graphene quantum Hall bar element 300. Further, the split branches play a great role when they represent places where current is injected.

Figure 3B:
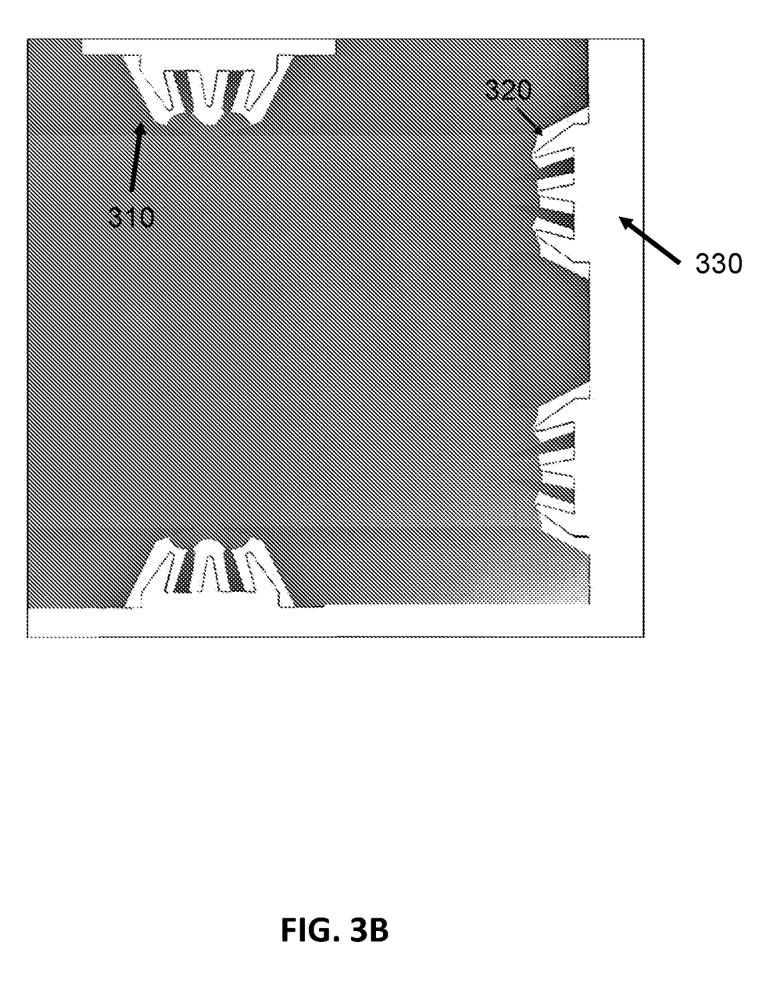
FIG. 3B is a diagram of contacts in connection with a graphene quantum Hall bar element of FIG. 3A in accordance with aspects of the present disclosure.

FIG. 3B illustrates a diagram of contacts in connection with the graphene quantum Hall bar element 300 of FIG. 3A in accordance with aspects of the present disclosure. The contact pad 310 of the graphene quantum Hall bar element 300 is covered by a protective layer 320 and is connected to contacts 330. The protective layer 320 may be made of a material composed of palladium (Pd) and/or gold (Au). Since the graphene is prone to stick to organic materials, the protective layer 320 prevents the graphene from sticking to organic materials.

The contacts 330 may be used for any other interconnections and be made of niobium (Nb), titanium (Ti), nitrogen (N), and any combination thereof. Between the superconducting contacts 330 and the graphene, there is no substantial resistance or interconnection resistance, thereby minimizing the unwanted internal resistances while its superconductivity is maintained.

Further, various configuration designs of the graphene quantum Hall bar elements as shown in FIGS. 2A-2C may provide large-scale production and stabilization of graphene and provide variable quantized values to be needed or required for resistance standards.

The contacts 330 becomes a superconductor under the temperature lower than or equal to 12.5 Kelvin ("K") and under the magnetic flux density lower than or equal to 9 Tesla ("T"). The temperature range and the magnetic flux density range are well over the requirements of future precision QHR measurements. The superconducting features of the contacts 330 are shown in graph 400 in FIG. 4. The vertical axis of the graph 400 represents resistance in Ohm ($\Omega$) and the horizontal axis represents temperature in K. Measurement values are plotted in a curve 410.

Figure 4:
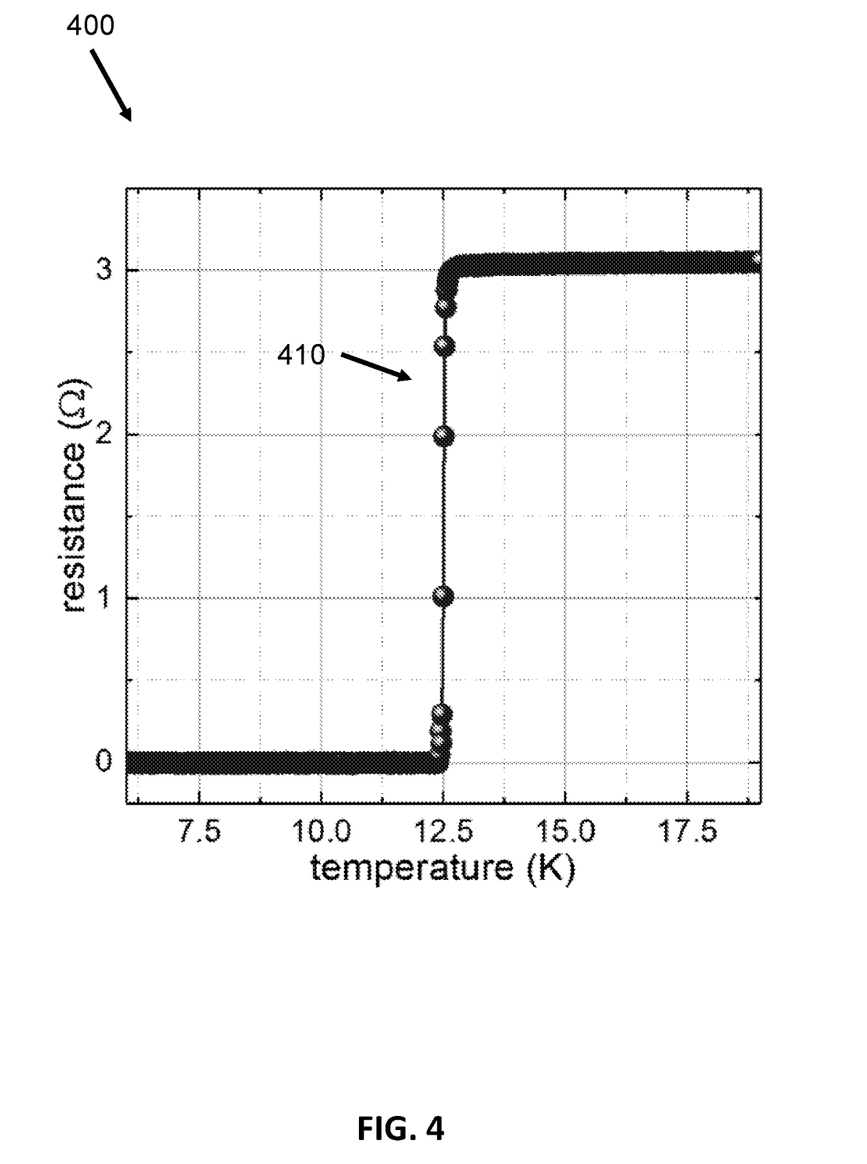
FIG. 4 is a plot of critical temperature transition of superconducting material used for the contacts of FIG. 3B in accordance with aspects of the present disclosure.

The resistance of the contacts 330 is about 3$\Omega$ when the temperature is over 12.5 K, and drops to zero when the temperature is less than or equal to 12.5 K. Thus, the curve 410 shows transition at 12.5 K and the contacts 330, which is a combination of niobium (Nb), titanium (Ti), and nitrogen (N), or for example niobium titanium nitride (NbTiN), becomes a superconductor under 12.5 K.

Figure 5:
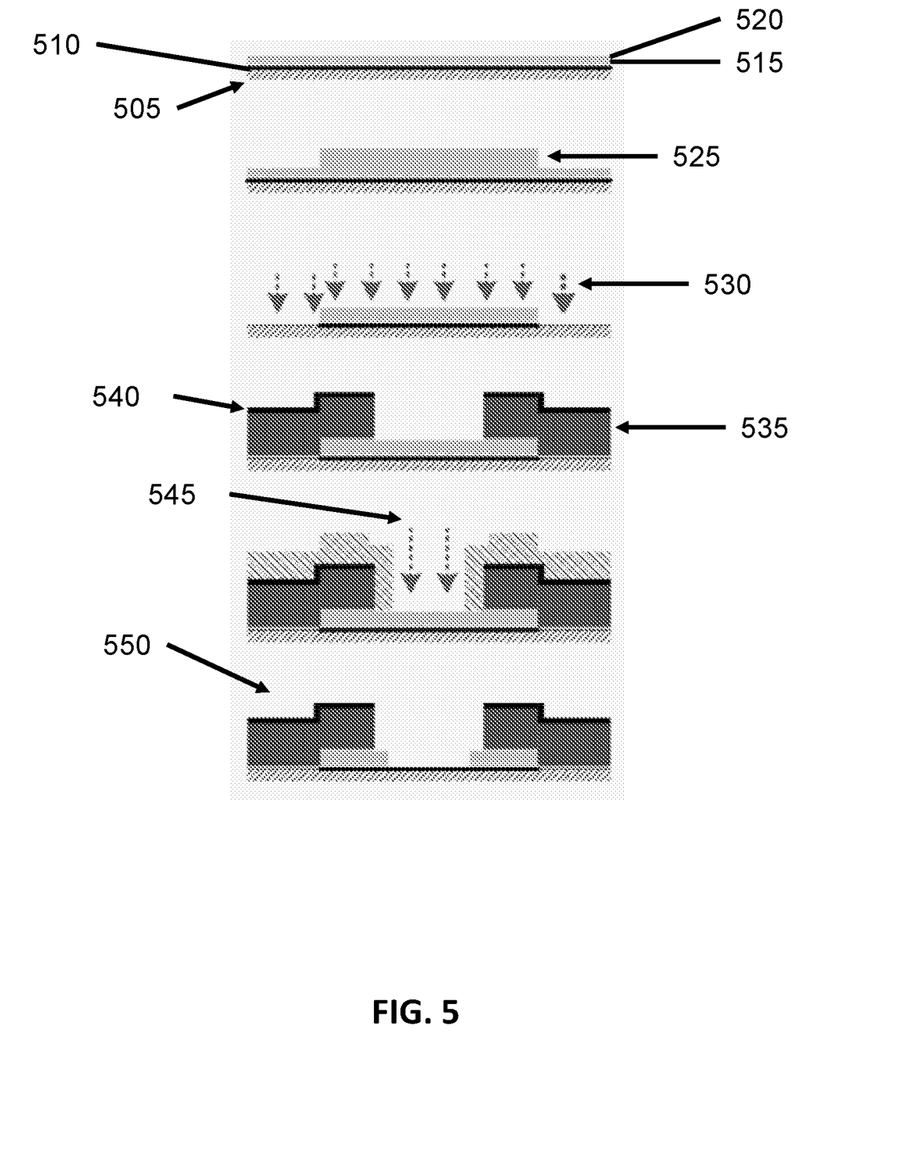
FIG. 5 is a graphical illustration of photolithography processes for fabricating a graphene quantum Hall bar element in accordance with aspects of the present disclosure.

Photolithography processes for fabricating a graphene quantum Hall bar element are graphically illustrated from the top illustration to the bottom illustration in FIG. 5 in accordance with aspects of the present disclosure. In the top illustration, graphene may be epitaxially grown on a substrate 505, the epitaxial graphene (EG) 510 may then be shielded by a thin layer of palladium 515 and/or gold 520 to allow for contaminant-free graphene/metal contacts. The substrate 505 may be a 4H—SiC(0001) semi-insulating substrate with a miscut, relative to the (0001) atomic plane of 4H—SiC(0001), which is less than or equal to 0.10°.

A mask 525 of palladium and gold may cover the thin gold layer 520 as shown in the second illustration from the top. Argon (Ar) gas plasma 530 is used to etch the thin gold layer 520, the thin palladium layer 515, and the EG 510 without the portion covered by the mask layer 525, as shown in the third illustration from the top.

Niobium titanium nitride (NbTiN) is sputtered to form a contact layer 535 over a portion of the mask layer 525 and portions of the substrate 505, where the thin gold layer 520, the thin palladium layer 515, and the EG 510 have been etched or removed, as shown in the fourth illustration from the top. The contact layer 535 may have a thickness of about 340 nm.

In an aspect, Ti may be sputtered to form an adhesion layer before NbTiN is sputtered, and may have a thickness of about 7.5 nm. In another aspect, platinum (Pt) 540 may be sputtered over the contact layer 535 to prevent surface oxidation and have a thickness of about 30 nm.

As shown in the fifth and sixth illustrations from the top, a photolithography process is used to open a window to the mask layer 525. Aqua regia or diluted aqua regia 545 is applied to remove the mask layer 525 with the thin palladium layer 515 and the thin gold layer 520. This wet-etching procedure does not harm the EG 510. As a result, the only connection portion between the contact layer 535 and the EG 510 constitutes the desired contacts. Detailed description of the photolithography process for fabricating a graphene quantum Hall bar element may be found in "Two-Terminal and Multi-Terminal Designs for Next-Generation Quantized Hall Resistance Standards: Contact Material and Geometry," *IEEE Transactions on Electron Devices*, Vol. 66, No. 9, pp 3973-3977, September 2019, which is hereby incorporated by reference in its entirety. It is noted that "Two-Terminal and Multi-Terminal Designs for Next-Generation Quantized Hall Resistance Standards: Contact Material and Geometry" is substantially equivalent to "Contact material and geometry design choices for next generation quantized Hall resistances," which was submitted with U.S. Provisional Patent Application No. 62/813,526 as an exhibit.

Figure 6A:
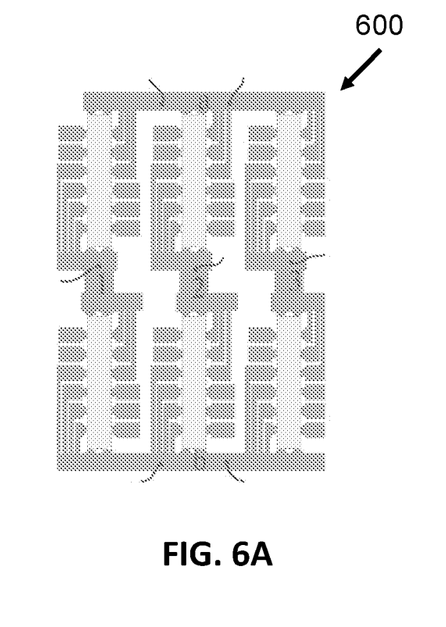
FIG. 6A is a graphical illustration of wire bonding for source/drain resistance measurements of a graphene quantum Hall array resistance device in accordance with aspects of the present disclosure.

FIG. 6A illustrates an example of wire bonding for source/drain resistance measurements of graphene quantum Hall bar elements 600 in accordance with aspects of the present disclosure. In this example, two graphene quantum Hall bar elements 600 in each pair are connected in series and three pairs of graphene quantum Hall bar elements 600 are connected in parallel. Reference points "a" and "b" are source and drain, respectively. Reference points "1," "2," and "3" are centers of three pairs of graphene quantum Hall bar elements 600, where potential difference is measured as a function of magnetic flux density. In this example, the rectangle of each graphene quantum Hall bar element has six contact pads in the length direction and two contact pads in the width direction. The rectangular shape of the graphene quantum Hall bar element is 2220 μm in the length direction and 400 μm in the width direction. The distance between two adjacent contact pads in the length direction is 320 μm.

Figure 6B:
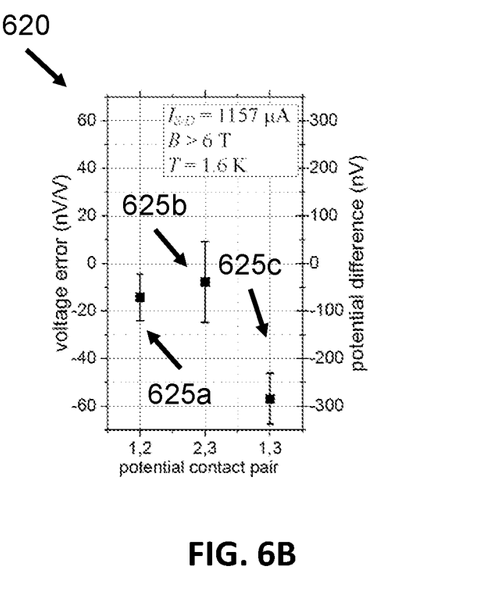
FIG. 6B is a plot of measurements for potential differences and voltage errors between pairs of center locations of the graphene quantum Hall array resistance device of FIG. 6A.

FIG. 6B illustrates a graph 620 including a boxplot showing measurements for potential differences and voltage errors between pairs of center locations of the graphene quantum Hall bar elements 600 of FIG. 6A. The left vertical axis represents voltage errors in nV/V, the right vertical axis represents potential differences in nV, and the horizontal axis represents contact pairs. The measurements are taken under the magnetic flux density greater than 6 Tesla and the temperature of 1.6 K with current of 1,156 µA flowing between the source and the drain. The boxplot includes three parts 625a-625c, which show measurements at contact pair of "1" and "2," at contact pair of "2" and "3," and at contact pair of "1" and "3." For example, the measurements for potential differences between "1" and "2" have a range of potential difference between about 0 and about −100 nV and a range of voltage errors between about 0 and −20 nV/V.

Figure 6C:
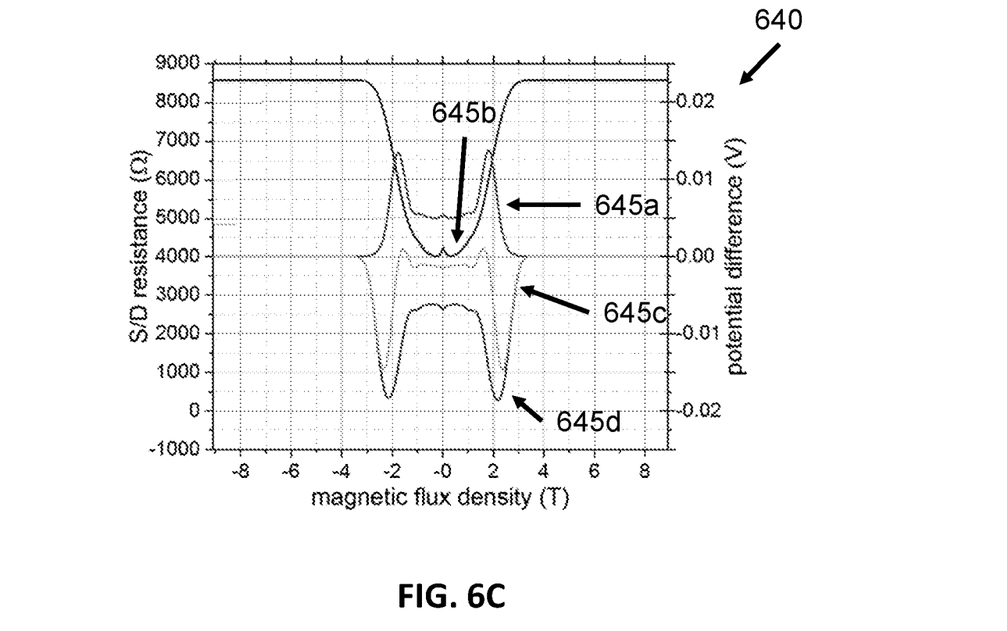
FIG. 6C is a plot of resistance measurements at the source/drain positions and potential differences at the center locations common to each pair of the graphene quantum Hall array resistance device of FIG. 6A.

FIG. 6C illustrates a graph 640 showing measurements for source/drain resistances and potential differences between the reference points "1," "2," and "3" based on the configuration shown in FIG. 6A The left vertical axis represents a resistance (S/D) between the source and the drain in Ω, the right vertical axis represents a potential difference in V, and the horizontal axis represents a magnetic flux density in T. Curve 645a is located in the top in the middle part of the horizontal axis and represents a potential difference between reference points "1" and "2," curve 645b is located in the second from the top in the middle part of the horizontal axis and represents a resistance between the source and the drain, curve 645c is located in the third from the top in the middle part of the horizontal axis and represents a potential difference between reference points "1" and "3," and curve 645d is located in the bottom in the middle part of the horizontal axis and represents a potential difference between reference points "2 and 3."

Based on the second curve 645b, the S/D resistance or $R_K$ is maintained at about 8,604Ω when the magnetic flux density is greater than or equal to about 3.5 T, and the potential differences among "1," "2," and "3" based on the curves 645a, 645c, and 645d become zero volts when the magnetic flux density is greater than or equal to about 3.5 T.

Figure 7A:
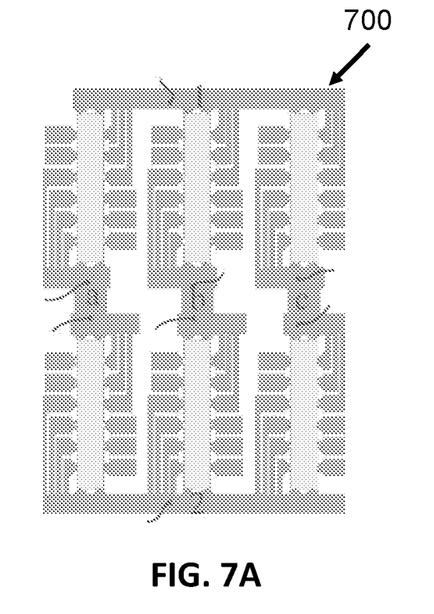
FIG. 7A is a graphical illustration of wire bonding for source/drain resistance measurements of a graphene quantum all array resistance device in accordance with aspects of the present disclosure.

FIG. 7A illustrates an example of wire bonding for source/drain resistance measurements of a graphene quantum Hall bar elements 700 in accordance with aspects of the present disclosure. In this example, two graphene quantum Hall bar elements 700 in each pair are connected in series and three pairs of graphene quantum Hall bar elements 700 are connected in parallel. Reference points "1" and "2" are source and drain, respectively. Reference points "a," "b," and "c" are centers of three pairs of graphene quantum Hall bar elements, where potential difference is measured as a function of magnetic flux density. In this example, the rectangle of each graphene quantum Hall bar element has six contact pads in the length direction and two contact pads in the width direction.

Figure 7B:
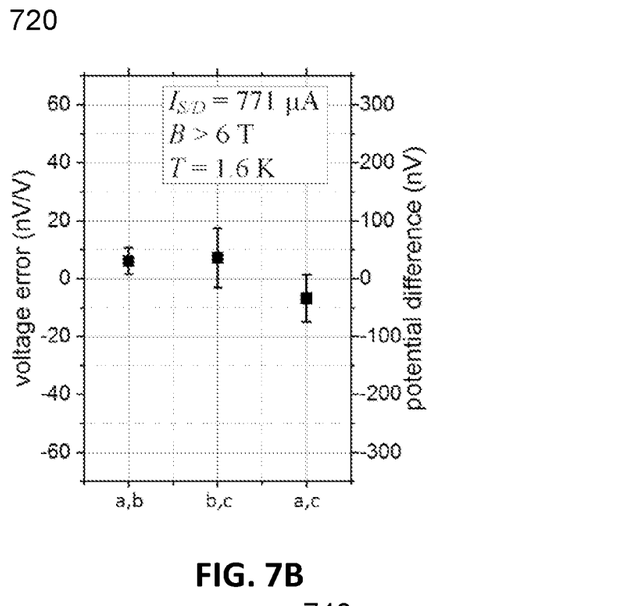
FIG. 7B is a plot of measurements for potential differences and voltage errors between center locations of the graphene quantum Hall array resistance device of FIG. 7A.

FIG. 7B illustrates a graph 720 including a boxplot showing measurements for potential differences and voltage errors between pairs of center locations of the graphene quantum Hall bar elements 700 of FIG. 7A. The left vertical axis represents voltage errors in nV/V, the right vertical axis represents potential differences in nV, and the horizontal axis represents potential contact pairs. The measurements are taken under the magnetic flux density greater than 6 T and the temperature of 1.6 K with current of 771 µA flowing between the source and the drain. The boxplot includes three parts 725a-725c. Three parts 725a-725c show measurements at the contact pair of "a" and "b," at the contact pair of "b" and "c," and at the contact pair of "a" and "c." Ideally, the potential difference between "a" and "b" should be zero. However, under the influence of the magnetic flux density, Hall voltage may occur between "a" and "b". For example, the measurements for potential differences between "a" and "b" have a range of potential difference between about 0 and about 50 nV and a range of voltage errors between about 0 and about 10 nV/V.

Figure 7C:
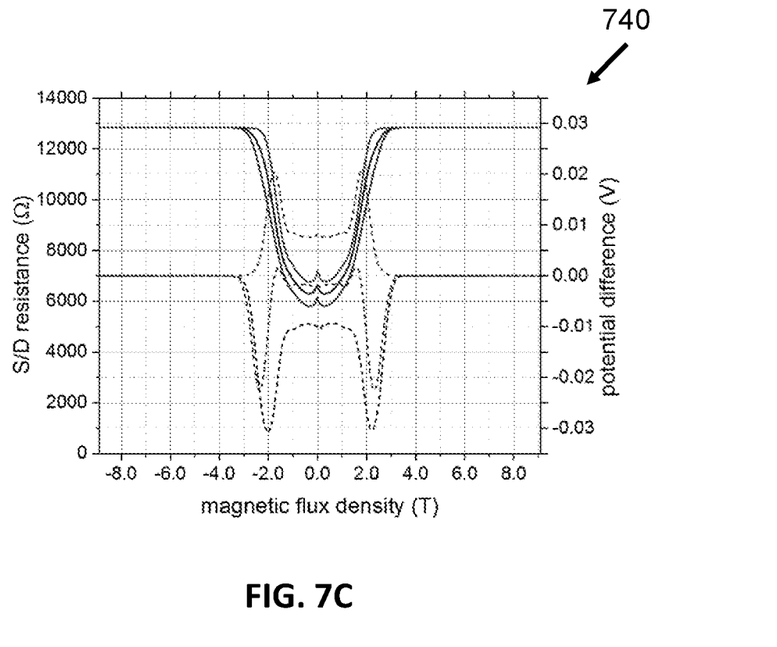
FIG. 7C is a plot of resistance measurements for the source/drain positions and of potential differences for the center locations common to each pair of the graphene quantum Hall array resistance device of FIG. 7A.

FIG. 7C illustrates a graph 740 showing measurements for source/drain (S/D) resistances and potential differences between the reference points "a," "b," and "c" based on the configuration shown in FIG. 7A The left vertical axis represents the S/D resistance in Ω, the right vertical axis represents a potential difference in V, and the horizontal axis represents a magnetic flux density in T. As shown in FIG. 7C, there are six curves, three of which being in solid curves and the other three in dotted curves. Three solid curves represent potential differences in V among reference points "a," "b," and "c," and three dotted curves represent S/D resistances in Ω among the three reference points "a," "b," and "c."

Regardless of choices of the reference points, when the magnetic flux is greater than or equal to about 3 T, the potential differences become zero and the S/D resistances become about 12906Ω. As such, the contacts of the graphene quantum Hall bar elements 700 show superconducting characteristics under the magnetic flux density, which is greater than or equal to 6 T and the temperature, which is equal to 1.6 K.

Figure 8:
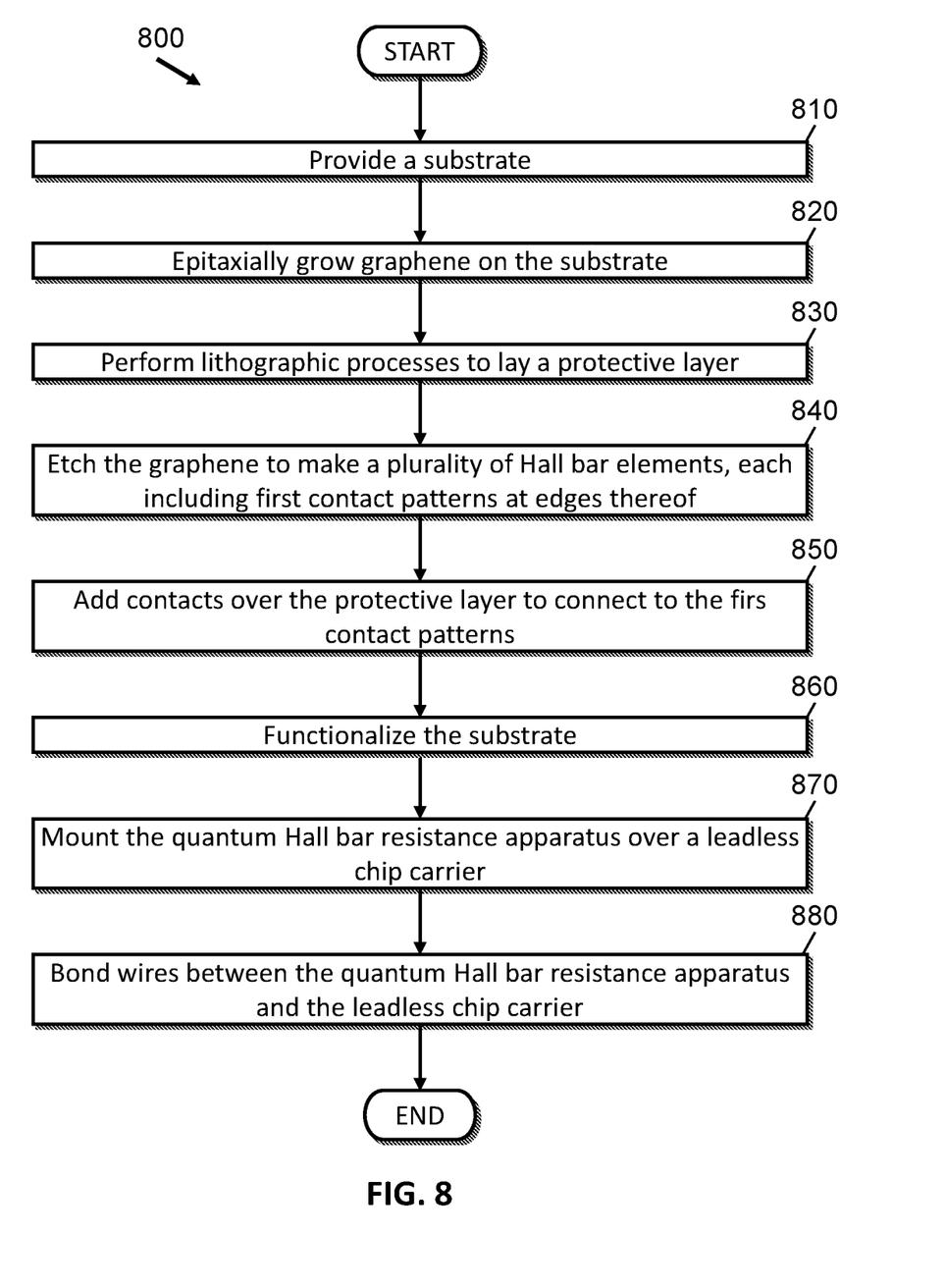
FIG. 8 is a flowchart for fabricating a graphene quantum Hall array resistance device in accordance with aspects of the present disclosure.

FIG. 8 shows a flowchart illustrating a method 800 for fabricating a graphene quantum Hall array resistance device in accordance with aspects of the present disclosure. The method 800 starts with providing a substrate in step 810. The substrate may be a silicon carbide (SiC) wafer, which is commonly found as a circular piece about 4 inches in diameter. The substrate may be a 4H—SiC(0001) semi-insulating substrate with a miscut, relative to the (0001) atomic plane of the 4H—SiC(0001), which is less than or equal to 0.10°. The substrate may be cut into 7.6 mm square chips. After the cutting, the diced chips may be cleansed with piranha etch solution and then further cleansed with diluted hydrofluoric acid (5:1 deionized $H_2O$ to hydrofluoric acid).

The chips may be provided with several drops of custom chemical solution at 6000 rpm for 1 min. The chemical solution may be composed of 99.8% isopropanol and 0.2% polymer blend as a photoresist, which may be composed of 75% propylene glycol methyl ether acetate, 5% diazonaphthoquinone sulfonic ester, 2% phenolic acid, 18% cresol novolak resin (also known as phenol formaldehyde resin). The cresol novolak resin may be important in successful graphene growth.

In step 820, graphene is epitaxially grown on the chips in a furnace. In particular, the side of the chips identified as the (0001) surface or silicon-face is placed in contact with polished graphite slab to promote homogenous epitaxial graphene growth. Step 820 may be performed in small steps as described below.

In the furnace, the chip and the slab are purged with Ar gas in step 820a. In the Ar and $H_2$ environment (about 3% $H_2$ by volume), temperature is ramped at a rate of about 3° C./s to 500° C. and is maintained at 500° C. for 5 minutes in step 820b.

The temperature is also ramped at the same rate to 1050° C. and is maintained at 1050° C. for one hour in step 820c. After the hour has passed, in step 820d, the gas environment is purified such that only Ar gas remains in the furnace and no more $H_2$ gas is used. The temperature is maintained at 1050° C. for an additional two hours in this purified gas environment.

In step 820e, the temperature is ramped again at the same rate to 1300° C. and is maintained at 1300° C. for one minute. Another ramping temperature is performed at the same rate to 1875° C. and the temperature remains at 1875° C. for 4.5 minutes in step 820f.

In step 820g, the temperature is now ramped down to room temperature by allowing the furnace to cool overnight. After cooling down, the graphene is epitaxially grown on the chips. Such epitaxial growth may form a mono layer of graphene over the chips.

Lithographic processes are performed to form a protective layer and contacts in step 830. The protective layer may be made of Pd and Au. Specifically, for example, 10 nm of Pd may be deposited onto the chips and 15 nm of Au may be also deposited onto the chips using electron beam deposition. The initial pressure of the beam deposition may be about $10^{-7}$ Torr.

In step 840, the graphene is etched to make a plurality of quantum Hall bar elements, each including first contact patterns at edge thereof, such as the split branches shown in FIG. 3B. This is also performed in small steps. First, a "lift-off" photoresist is rotated at 4000 rpm for 45 seconds and the rotation speed may be accelerated to 5000 rpm/s in step 840a. The lift-off photoresist may be composed of 75% cyclopentanone, 15% propylene glycol monomethyl ether, and 10% polyaliphatic imide copolymer. Chips are baked immediately after spinning the lift-off photoresist at 170° C. for 5 minutes in step 840b.

A "capping" photoresist is rotated at 4500 rpm for 45 seconds and the rotation speed may be accelerated to 5000 rpm/s in step 840c. The capping photoresist may be composed of 75% electronic-grade propylene glycol monomethyl ether acetate, 15% mixed cresol novolak resin, and 10% diazo photoactive compound. The chips are baked at 115° C. for 1 minute immediately after spinning the capping photoresist in step 840d.

In step 840e, the chips are exposed to ultraviolet light, of which wavelength may be 365 nm, for 5 seconds to write a custom shape such as the shape of the graphene quantum Hall bar element 300 of FIG. 3A or other designs shown in FIGS. 2A-2C. This can be performed on a maskless aligner. In an aspect, this can be done with a high-precision mask and bond aligner.

In step 840f, the exposed chips are taken out of the furnace and washed with a solution of 97% water and 3% tetramethylammonium hydroxide for 1 minute. This removes the photoresists exposed to ultraviolet light, leaving a region of palladium/gold-coated graphene exposed to air in the shape of FIG. 3. In step 840g, the chips are further washed in deionized $H_2O$.

The chips are dry-etched with argon plasma under pressure of 4 Pascal (Pa) and power of 50 Watts (W) for 30 seconds in step 840h, and 50 nm of gold is deposited onto the chips in step 840i.

In step 840j, the chips are placed in 100 mL of N-Methyl-2-pyrrolidone for one hour at 75° C., thereby allowing the remaining photoresists to lift off from the chips. In step 840k, the chips are dry-etched with argon plasma under pressure of 4 Pa and power of 150 W for 7.5 minutes.

The steps 840a through 840k are repeatedly performed with a photomask in the shape of the first contact patterns, which are shown in FIG. 3A, in step 840e.

Contacts are deposited over the protective layer in step 850. The contacts may be made of any combination of niobium, titanium, and nitrogen. Specifically, 7.5 nm of titanium is deposited, 330 nm of niobium titanium nitride is deposited, and finally 50 nm of platinum as a capping layer is deposited onto the chips using electron beam deposition in step 850a. The initial pressure may be $1.33 \times 10^{-3}$ Pa.

In step 850b, the chips are placed in 100 mL bath of N-Methyl-2-pyrrolidone for one hour at 75° C., thereby allowing the remaining photoresists to lift off from the substrate.

To remove the protective layer formed in step 830, steps 840c through 840h are repeated with a photomask design with six rectangles, for example, 2400 μm in length by 450 μm in width in step 840e. When designing this photomask, these six rectangles should be aligned with the six Hall bars shown in FIG. 2A, such that each of the 2220 μm by 400 μm Hall bars have their general rectangular perimeter enclosed within the larger rectangle, while excluding all or part of the split branches or trident features of the contact pads (e.g., the contact pads 310 of FIG. 3A).

The electrical contact pads may not be within this rectangular window. To enhance measurement accuracy and to enable potential device miniaturization, the metal/graphene contacts are split into several branches. This split branch design allows for the edge states to equilibrate with the electric potential of the source/drain contacts in the quantum Hall regime. The split branches play a role when they represent the point where current is injected.

In step 850c, the chips are submerged in diluted aqua regia, which is composed of 1:1 deionized $H_2O$ to aqua regia, for 45 seconds. Final shapes formed from step 850c may look like the shape of the contacts 330 in FIG. 3B. After treatment with the diluted aqua regia, the graphene Hall bar may not have any remaining metal. The three separated trident metal channels forming the source/drain contacts 330 enable graphene quantum Hall bar elements to perform significantly better due to minimizing the influence of the contact resistance.

In step 850d, the chips are vigorously cleaned with acetone squirt bottle in one minute, and then placed in acetone bath for two hours.

In step 850e, the chips are transferred to isopropanol bath for five minutes. After drying the chips with nitrogen gas gun in step 850f, the graphene quantum Hall bar elements are formed. For example, 200A, 200B, or 200C may be formed after step 850f.

In step 860, a similar carrier density for quantum Hall bar elements may be provided by functionalizing the chips with chromium tricarbonyl using a small deposition furnace. Raw material, chromium hexacarbonyl, may be needed. Functionalization may be also performed in small steps as follows:

In step 860a. the chamber door is opened and phosphor-bronze boat designed to carry the chips and functionalizing compound are removed.

In step 860b, the chips are loaded into the boat and compound storage pocket is left empty. In step 860c, the boat is loaded into the furnace chamber.

In step 860d, N2 gas is allowed to flow through the open furnace chamber for a few minutes.

In step 860e. the furnace chamber door is closed and $N_2$ gas flow is shut off.

In step 860f, the boat is baked at 130° C. for one hour. The range of temperature tolerance may be ±10° C.

After baking, in step 860g, the same amount of $N_2$ flow is restarted and used while opening the furnace chamber. In step 860h when the furnace chamber door is opened, the boat is removed and 100 mg of chromium hexacarbonyl [$Cr(CO)_6$] is loaded into a designated pocket in the boat.

The boat is reloaded, the furnace chamber is closed, and the $N_2$ gas flow is turned off in step 860h.

In step 860i, while the temperature of the furnace chamber is maintained at 130° C., the pressure of the furnace chamber is decreased to $10^{-2}$ Torr for 40 minutes.

In step 860k, the deposition process is complete, and in step 860l, the chamber heating source is turned off and the furnace chamber is cooled overnight before removing the chips. Detailed description of the functionalization may be found in "Gateless and reversible Carrier density tunability in epitaxial graphene devices functionalized with chromium tricarbonyl," Carbon 142 (2019), pp 468-474, which is hereby incorporated by reference in its entirety. It is noted that "Gateless and reversible carrier density tunability in epitaxial graphene devices functionalized with chromium tricarbonyl" is substantially equivalent to "Gateless and reversible carrier density tunability in epitaxial graphene devices functionalized with chromium tricarbonyl," which was submitted with U.S. Provisional Patent Application No. 62/813,526 as an exhibit.

Now referring back to FIG. 8, the quantum Hall bar resistance apparatus is mounted onto to a leadless chip carrier in step 870, and wires are bonded between the quantum Hall bar resistance apparatus with the leadless chip carrier. The final result may be like the quantum Hall resistance device 100 of FIG. 1. Depending on the configuration of the quantum Hall bar elements, various combination of S/D resistance in terms of the von Klitzing constant of resistance $R_K$ may be realized.

In an aspect, the carrier density may be adjusted by annealing the chip between 300 K and 360 K. Typically, functional devices are annealed at 350 K for 25 minutes.

In another aspect, the carrier density may be reset to a low value by leaving the chip in air for 24 hours and then annealing the chip between 300 K and 360 K The following table shows another aspect of the method 800. Purging and pre-sputtering steps are performed to ensure removal of possible gaseous contaminants in the furnace and on the sputter targets in steps 1 and 2. Titanium (radio frequency source) is deposited in step 3. After the second pre-sputter in step 4, niobium (direct current source) and titanium are both sputtered in a nitrogen/argon environment to promote growth of superconducting niobium titanium nitride in step 5. After a mild chamber flushing and pre-sputter in steps 6 and 7, platinum is deposited as a protective capping layer in step 8. During these eight steps, the flow of $N_2$ gas, Ar gas, the level of RF power, and the output power of a DC source may be controlled as shown below in the table.

| Step | 1 | 2 | 3 | 4 | 5 | 6 | 7 | 8 |
|---|---|---|---|---|---|---|---|---|
| Time (s) | 1200 | 600 | 360 | 300 | 600 | 60 | 300 | 300 |
| $N_2$ flow ($cm^{-3}$/min) | 120 | — | — | 3 | 3 | — | — | — |
| Ar flow ($cm^{-3}$/min) | 20 | 50 | 50 | 50 | 50 | 50 | 50 | 50 |
| RF Source (W) | — | 200 | 100 | 150 | 150 | — | — | — |
| DC Source (W) | — | 2 | — | 1.5 | 1.5 | — | 0.2 | 0.2 |

According to aspects of this present disclosure, the method 800 may be performed in a different way. For example, in step 820, instead of chemical solution composed of 99.8% isopropanol and 0.2% polymer blend, the chemical solution composed of 0.2% AZ5214E polymer, which is a photoresist, may be used. Further, instead of using palladium and gold for the protective layer in step 830, amorphous boron nitride (a-BN) may be used to encapsulate the graphene layer. In an aspect, the a-BN layer may form at least 20 nm thickness, which is sufficient to preserve longitudinal resistivity of the graphene layer. Detailed description of a-BN use as an encapsulation layer may be found in "Electrical Stabilization of Surface Resistivity in Epitaxial Graphene Systems by Amorphous Boron Nitride Encapsulation," ACS Omega 2017, vol. 2, pp 2326-2332, which is hereby incorporated by reference in its entirety. The rest of the method in use of a-BN is substantially similar to the method 800 as described above.

The aspects disclosed herein are examples of the disclosure and may be embodied in various forms. For instance, although certain aspects herein are described as separate aspects, each of the aspects herein may be combined with one or more of the other aspects herein. Specific structural and functional details disclosed herein are not to be interpreted as limiting, but as a basis for the claims and as a representative basis for teaching one skilled in the art to variously employ the present disclosure in virtually any appropriately detailed structure. Like reference numerals may refer to similar or identical elements throughout the description of the figures.

The phrases "in an aspect," "in aspects," "in various aspects," "in some aspects," or "in other aspects" may each refer to one or more of the same or different aspects in accordance with the present disclosure. A phrase in the form "A or B" means "(A), (B), or (A and B)." A phrase in the form "at least one of A, B, or C" means "(A); (B); (C); (A and B); (A and C); (B and C); or (A, B, and C)."

Any of the herein described methods, programs, algorithms or codes may be converted to, or expressed in, a programming language or computer program. The terms "programming language" and "computer program," as used herein, each include any language used to specify instructions to a computer, and include (but is not limited to) the following languages and their derivatives: Assembler, Basic, Batch files, BCPL, C, C+, C++, Delphi, Fortran, Java, JavaScript, machine code, operating system command languages, Pascal, Perl, PL1, scripting languages, Visual Basic, metalanguages which themselves specify programs, and all first, second, third, fourth, fifth, or further generation computer languages. Also included are database and other data schemas, and any other meta-languages. No distinction is made between languages which are interpreted, compiled, or use both compiled and interpreted approaches. No distinction is made between compiled and source versions of a program. Thus, reference to a program, where the programming language could exist in more than one state (such as source, compiled, object, or linked) is a reference to any and all such states. Reference to a program may encompass the actual instructions and/or the intent of those instructions.

The systems described herein may also utilize one or more controllers to receive various information and transform the received information to generate an output. The controller may include any type of computing device, computational circuit, or any type of processor or processing circuit capable of executing a series of instructions that are stored in a memory. The controller may include multiple processors and/or multicore central processing units (CPUs) and may include any type of processor, such as a microprocessor, digital signal processor, microcontroller, programmable logic device (PLD), field programmable gate array (FPGA), or the like. The controller may also include a memory to store data and/or instructions that, when executed by the one or more processors, causes the one or more processors to perform one or more methods and/or algorithms.

It should be understood that the foregoing description is only illustrative of the present disclosure. Various alternatives and modifications can be devised by those skilled in the art without departing from the disclosure. Accordingly, the present disclosure is intended to embrace all such alternatives, modifications and variances. The aspects described with reference to the attached drawing figures are presented only to demonstrate certain examples of the disclosure. Other elements, steps, methods, and techniques that are insubstantially different from those described above and/or in the appended claims are also intended to be within the scope of the disclosure.

What is claimed is:

1. A quantum Hall resistance apparatus to improve resistance standards, the quantum Hall resistance apparatus comprising:
    a substrate;
    a plurality of Hall bars made of graphene electrical conduction layer, which is epitaxially grown on the substrate, each Hall bar having a plurality of first contact patterns at edges thereof;
    a plurality of contacts, each including a second contact pattern and configured to connect to a corresponding first contact pattern; and
    a protective layer configured to protect first contact patterns and to increase adherence between the first contact patterns and the second contact patterns,
    wherein the plurality of contacts become a superconductor at a temperature lower than or equal to a predetermined temperature and under up to a predetermined magnetic flux density.

2. The quantum Hall resistance apparatus according to claim 1, wherein each first contact pattern includes at least two extensions therefrom.

3. The quantum Hall resistance apparatus according to claim 2, wherein each second contact pattern fits to a corresponding first contact pattern.

4. The quantum Hall resistance apparatus according to claim 1, wherein the predetermined temperature is 12.5 Kelvin.

5. The quantum Hall resistance apparatus according to claim 1, wherein the predetermined magnetic flux density is 9 Tesla.

6. The quantum Hall resistance apparatus according to claim 1, wherein the protective layer is formed of palladium and gold.

7. The quantum Hall resistance apparatus according to claim 1, wherein the plurality of contacts are made of niobium, titanium, nitrogen, or any combination thereof.

8. The quantum Hall resistance apparatus according to claim 1, wherein the graphene is a mono-layer.

9. The quantum Hall resistance apparatus according to claim 1, wherein the quantum Hall resistance apparatus is functionalized with chromium tricarbonyl ($Cr(CO)_3$).

10. The quantum Hall resistance apparatus according to claim 1, wherein the substrate is a 4H—SiC(0001) semi-insulating substrate with a miscut, relative to the (0001) atomic plane of the 4H—SiC(0001), which is less than or equal to 0.10°.

11. The quantum Hall resistance apparatus according to claim 1, wherein the plurality of contacts with respect to the plurality of Hall bars are connected in series, parallel, or combination thereof to make a resistance standard.

12. A method for making a quantum Hall bar resistance apparatus to improve resistance standards, the method comprising:
    providing a substrate;
    epitaxially growing a graphene to form an electrical conduction layer on the substrate;
    etching the graphene to make a plurality of Hall bars, each including a plurality of first contact patterns at edges thereof;
    performing lithographic processes to lay a protective layer configured to protect the plurality of first contact patterns; and
    adding a plurality of contacts over the protective layer, each contact having a second contact pattern to connect to a corresponding first contact pattern,
    wherein the plurality of contacts become a superconductor at a temperature lower than or equal to a predetermined temperature and under up to a predetermined magnetic flux density.

13. The method according to claim 12, wherein epitaxially growing the graphene includes:
    placing the substrate into a furnace;
    purging the substrate with argon; and
    step-wisely increasing a temperature in the furnace to 1875° C. at a same rate in environment including argon and hydrogen.

14. The method according to claim 13, wherein the hydrogen is removed from the furnace at 1050° C.

15. The method according to claim 13, wherein a silicon face of the substrate is in contact with a polished graphite slab in the furnace.

16. The method according to claim 12, wherein the predetermined temperature is 12.5 Kelvin.

17. The method according to claim 12, wherein the predetermined magnetic flux density is 9 Tesla.

18. The method according to claim 12, wherein the protective layer is formed of palladium and gold.

19. The method according to claim 12, further comprising:
    functionalizing the quantum Hall bar resistance apparatus with chromium tricarbonyl ($Cr(CO)_3$).

20. The method according to claim 12, wherein the contacts are made of niobium, titanium, nitrogen, and any combination thereof.

21. The method according to claim 12, further comprising:
    mounting the quantum Hall bar resistance apparatus over a leadless chip carrier; and
    bonding wires between the quantum Hall bar resistance apparatus and the leadless chip carrier.

22. A quantum Hall resistance apparatus to improve resistance standards, the quantum Hall resistance apparatus comprising:
    a substrate;
    one or more Hall bars epitaxially grown on the substrate, each Hall bar having a plurality of first contact patterns at edges thereof;
    one or more contacts, each including a second contact pattern connected to a corresponding first contact pattern; and
    a protective layer between the first contact patterns and the second contact patterns,
    wherein the one or more contacts become a superconductor under one or more of the following conditions: (i)

at a temperature of 12.5 Kelvin or less; or (ii) at a magnetic flux density of 9 Tesla or lower.

* * * * *